US007476609B2

(12) United States Patent
Judong

(10) Patent No.: US 7,476,609 B2

(45) Date of Patent: Jan. 13, 2009

(54) FORMING OF A CAVITY IN AN INSULATING LAYER

(75) Inventor: Fabienne Judong, Argentine (FR)

(73) Assignee: STMicroelectronics S.A., Montrouge (FR)

( * ) Notice: Subject to any disclaimer, the term of this patent is extended or adjusted under 35 U.S.C. 154(b) by 257 days.

(21) Appl. No.: 11/553,902

(22) Filed: Oct. 27, 2006

(65) Prior Publication Data

US 2007/0098344 A1 May 3, 2007

(30) Foreign Application Priority Data

Oct. 28, 2005 (FR) .................................. 05 53300

(51) Int. Cl.
*H01L 21/44* (2006.01)

(52) U.S. Cl. ....................... 438/623; 438/700; 438/710; 438/714; 438/723; 438/783; 257/E21.226; 257/E21.252; 257/E21.269; 257/E21.275; 257/E21.276

(58) Field of Classification Search ................. 438/513, 438/623, 680, 700, 708, 710, 714, 723, 782, 438/783, 798; 257/E21.226, 252, 268, 269, 257/275, 276, 278, 546, 576, 577, 578
See application file for complete search history.

(56) References Cited

U.S. PATENT DOCUMENTS

| | | | | |
|---|---|---|---|---|
| 4,764,245 | A * | 8/1988 | Grewal | 438/700 |
| 4,994,409 | A * | 2/1991 | Yoon et al. | 438/9 |
| 5,094,900 | A | 3/1992 | Langley | 428/131 |
| 5,622,886 | A * | 4/1997 | Allum et al. | 438/238 |
| 5,716,495 | A * | 2/1998 | Butterbaugh et al. | 438/708 |
| 6,077,742 | A | 6/2000 | Chen et al. | 438/255 |
| 6,284,644 | B1 * | 9/2001 | Aug et al. | 438/623 |
| 6,846,745 | B1 * | 1/2005 | Papasouliotis et al. | 438/706 |
| 7,217,658 | B1 * | 5/2007 | Bayman et al. | 438/680 |
| 7,247,939 | B2 * | 7/2007 | Huang et al. | 257/700 |
| 2003/0022505 | A1 | 1/2003 | Ouellet et al. | 438/704 |

FOREIGN PATENT DOCUMENTS

| | | |
|---|---|---|
| JP | 62-118529 | 5/1987 |

* cited by examiner

*Primary Examiner*—Michael S Lebentritt
(74) *Attorney, Agent, or Firm*—Lisa K. Jorgenson; Robert Iannucci; Seed IP Law Group PLLC

(57) ABSTRACT

A method for forming, by dry etch, an opening of a given shape in a silica glass layer, the layer having a doping profile similar to the shape and the etch plasma being a non-carbonated fluorinated plasma causing a non-directional etching.

18 Claims, 3 Drawing Sheets

FORMING OF A CAVITY IN AN INSULATING LAYER

BACKGROUND OF THE INVENTION

1. Field of the Invention

The present invention relates to the forming of integrated circuits. More specifically, the present application relates to the forming of cavities in insulating layers.

2. Description of the Related Art

In many integrated devices, in particular in optical devices, it is desirable to form cavities in insulating layers. Such cavities are especially used to obtain a maximum isolation.

FIGS. 1A to 1C illustrate, in partial simplified cross-section view, different steps of a known method for forming a cavity in an insulating layer.

As illustrated in FIG. 1A, the upper portion of an integrated circuit 1 is covered with an insulating layer 3 itself covered with an insulating layer 5. Portion 1 generally corresponds either to a metallization level, or to the semiconductor substrate in which active devices are formed. Layers 3 and 5 are made of different materials selectively etchable with respect to each other. For example, portion 1 is a single-crystal silicon substrate, layer 3 is a silicon oxide layer ($SiO_2$), and layer 5 is a silicon nitride layer ($Si_3N_4$).

At the next steps illustrated in FIG. 1B, a dry etching of layer 5 and a selective wet etching of layer 3 by means of a same mask 7, are successively performed. An opening 9 is thus formed, which exhibits in upper layer 5 a substantially straight, vertical shape, which widens in layer 3. The dry etching is generally performed by means of a carbon tetrafluoride plasma ($CF_4$). The wet etching is performed by means of a solution selectively etching the sole layer 3, without etching layer 5.

Then, as illustrated in FIG. 1C, an insulating layer 11 is deposited to seal the lips of opening 9 of FIG. 1B while maintaining a cavity 13 free.

Another disadvantage lies in the difference in optical properties between layers 3 and 5. When the cavities are formed in the transparent portion of an optical device such as an image sensor or an imager, this difference affects the device operation all the more as the silicon nitride used as layer 5 is not transparent.

Another disadvantage of such a method lies in the fact that the shape given to the cavity is set and cannot be selected.

Further, it should be noted that opening 9 exhibits an abrupt change of slope at the interface between layers 3 and 5—an abrupt widening in layer 3—which translates on deposition of sealing layer 11 by the forming of angle cavities 15. As will be exposed subsequently, such angle cavities 15 may be undesirable in optical devices.

To have cavities in a transparent insulating layer, another cavity-forming method has been provided.

FIG. 2 illustrates in partial simplified cross-section view an intermediary step of another cavity-forming method. The step of FIG. 2 corresponds to the step of FIG. 1B of the first method.

Upper layer 21 of an integrated circuit is covered with a silicon oxide layer 23 doped by means of phosphorus ($P^+$). Layer 23 is covered with an undoped silicon oxide layer 25. Layer 23 is doped, generally in situ, at a concentration ranging between $10^{17}$ and $3\times10^{18}$ at/cm$^3$.

An etching capable of forming a vertical well, shown in dotted lines, is performed by means of a mask 27 illustrated in dotted lines in layers 23 and 25. This etching is a dry etch performed by means of a fluorocarbon plasma such as a carbon tetrafluoride plasma ($CF_4$).

After removal of mask 27, the structure is dipped into a hydrofluoric acid bath generally intended for the cleaning of the polymer residues of mask 27. Then, doped silicon oxide layer 23 is etched. This etching is stronger than the corresponding etching of upper layer 25 illustrated by the difference between the dotted lines and the full lines delimiting the upper portion of opening 29.

A profile similar to that of FIG. 1C comprising a wide lower opening topped with an opening of small dimensions is then found again. The method carries on with the sealing of the opening lips to keep a cavity in the lower portion.

However, a disadvantage of such a method lies in the etching of layer 25 on etching of layer 23. The real dimensions of opening 29 are increased with respect to those of mask 27. This poses problems in the sealing operation. In particular, if opening 29 is too large in its upper portion, the subsequently deposited sealing material partially fills the lower portion of the opening and the resulting cavity exhibits small dimensions with respect to cavity 13 of FIG. 1C.

Another disadvantage lies in the fact that the obtained cavity exhibits angle cavities 15 such as the cavity (13, FIG. 1C) obtained with the first known method.

BRIEF SUMMARY OF THE INVENTION

One embodiment of the present invention is a method for forming a cavity in an insulating layer which overcomes the disadvantages of known methods.

One embodiment of the present invention provides a method which uses a single insulating material.

One embodiment of the present invention provides a method which uses a transparent insulating material.

One embodiment of the present invention provides a method which enables modulating the shape of an opening formed in an insulating layer.

One embodiment of the present invention provides a method for forming an opening of a given shape in a silica glass layer. The method comprises non-directionally dry etching the silica glass layer with a non-carbonated fluorinated plasma to form the opening of the given shape, where the layer has a doping profile similar to the given shape. According to an embodiment of the present invention, the doping ion of the layer is selected from among fluorine and phosphorus.

According to an embodiment of the present invention, the doping ion concentration across the layer thickness varies within the range from $10^{17}$ to $3\times10^{18}$ at/cm$^3$.

According to an embodiment of the present invention, the etching by means of the non-carbonated fluorinated plasma is preceded by an etching by means of a carbonated fluorinated plasma.

According to an embodiment of the present invention, the plasma comprises sulfur hexafluoride ($SF_6$) or nitrogen trifluoride ($NF_3$).

According to an embodiment of the present invention, the etching is performed with no bombarding of the insulating layer.

An embodiment of the present invention also provides a method for forming a cavity of a given shape in an insulating layer, comprising the steps of:

- forming an insulating silica glass layer comprising a phosphorus or fluorine concentration profile having the given shape;
- forming a mask comprising an opening at the location where the cavity is to be formed;
- forming an opening in an upper portion of the layer by means of a carbonated plasma, the opening having lips;

removing the mask;

etching the insulating silica glass layer by means of a non-carbonated fluorinated plasma; and depositing a sealing material capable of occluding the lips of the opening of the upper portion.

According to an embodiment of the present invention, the method comprises, before deposition of the sealing material, the step of depositing on walls enclosing the opening a thin metal layer, the sealing material being transparent.

One embodiment of the present invention also provides an optical device comprising at least one cavity obtained by a method according to an embodiment of the present invention.

The foregoing and other features and advantages of the present invention will be discussed in detail in the following non-limiting description of specific embodiments in connection with the accompanying drawings.

DETAILED DESCRIPTION OF THE INVENTION

Figure 1A:
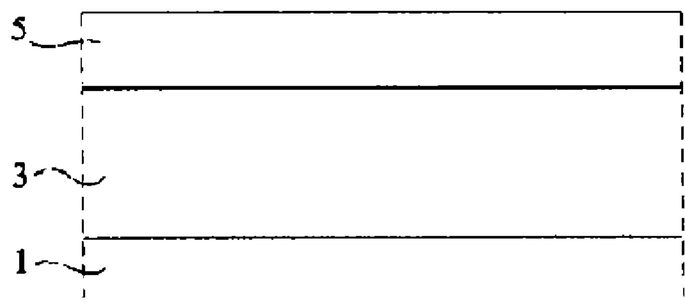
FIGS. 1A to 1C illustrate, in partial simplified cross-section view, a known method for forming a cavity in a stacking of insulating materials.
Figure 1B:
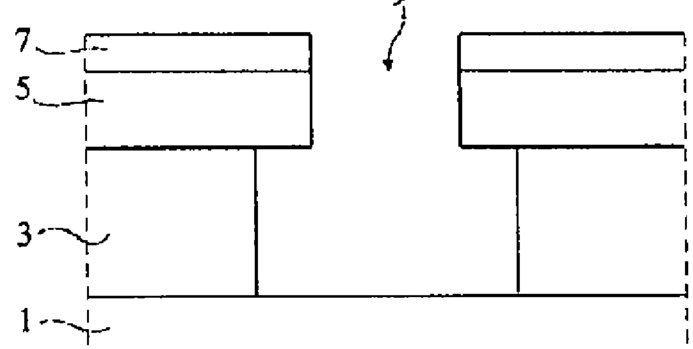

For clarity, the same elements have been designated with the same reference numerals in the different drawings and, further, as usual in the representation of integrated circuits, the various drawings are not to scale.

Figures 3A, 4:
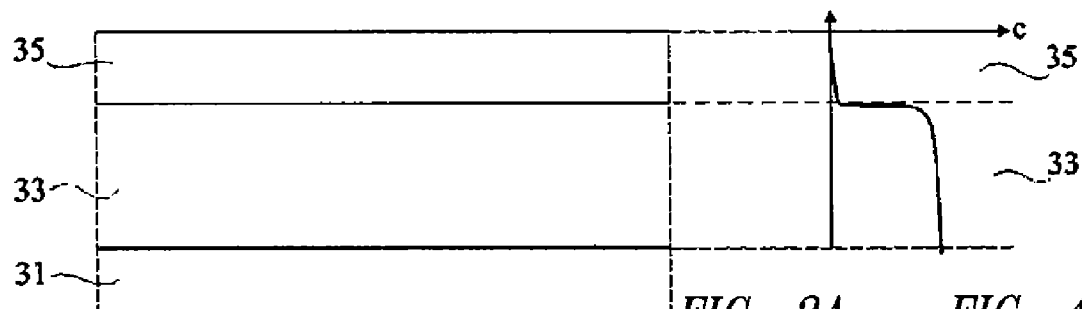
FIGS. 3A to 3C illustrate, in partial simplified cross-section view, a method for forming a cavity according to an embodiment of the present invention.
FIG. 4 schematically illustrates a doping ion concentration profile in a layer of FIG. 3, according to an embodiment of the present invention.
Figure 3B:
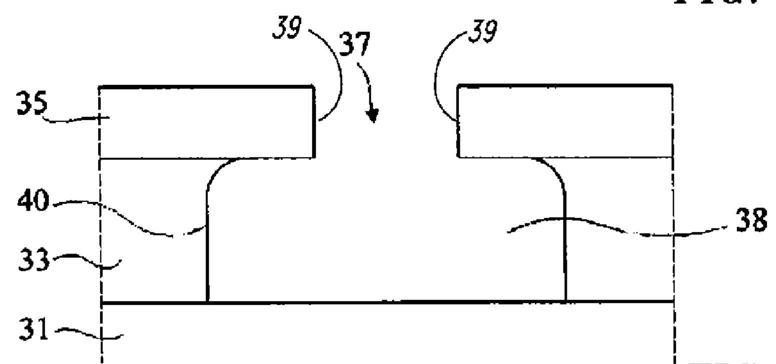
Figure 3C:
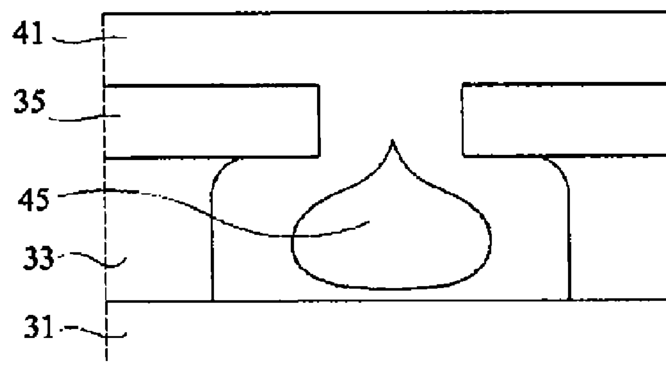

FIGS. 3A to 3C illustrate, in partial simplified cross-section view, different steps of a method for forming a cavity according to an embodiment of the present invention.

As illustrated in FIG. 3A, the method starts from an integrated circuit having its upper portion 31 covered with a silica glass layer 33 doped at a concentration ranging between $3\times10^{17}$ and $3\times10^{18}$ at/cm$^3$ with phosphorus or fluorine and with an undoped silica glass layer 35. The relative thicknesses of layers 33 and 35 will be discussed hereafter.

FIG. 4 schematically illustrates the concentration profile c of doping ions, phosphorus or fluorine, in layer 33. For clarity, FIG. 4 is drawn next to FIG. 3A and the different silica glass regions 35 and 33 of FIG. 3A are plotted in FIG. 4. In the shown example, the doping ion concentration in layer 33 is substantially constant.

At the next steps, illustrated in FIG. 3B, a straight opening 37 is formed in upper undoped layer 35 and in doped layer 33 by means of a first dry anisotropic etching. The dry etching is performed with a fluorocarbon plasma such as carbon tetrafluoride ($CF_4$). The location and the shape of opening 37 are determined by means of a mask, not shown. Opening 37 exhibits straight sides, for example, vertical, in accordance with the profile generally obtained by dry etching.

After removal of the mask, a second dry etching is performed by means of a non-carbonated fluorinated plasma such as a nitrogen trifluoride ($NF_3$) or, for example, sulfur hexafluoride ($SF_6$) plasma. Preferably, the second etching is performed with no bombarding. The non-carbonated fluorinated plasma leaves undoped layer 35 intact. Further, the non-carbonated fluorinated plasma isotropically etches doped layer 33 so that the shape of walls 40 of opening 38 is similar to the doping profile of layer 33, as will appear hereafter from the description of FIGS. 5 and 6, 7 and 8.

At the next steps, illustrated in FIG. 3C, a sealing layer 41 is deposited to close lips 39 of opening 37 and to maintain a cavity 45 in opening 38.

In one embodiment of the present invention, the cavity is formed in a single transparent insulating layer.

The method according to one embodiment of the present invention controls the dimension of opening 37. Indeed, the fact for undoped silica glass 35 not to be etched by the sulfur hexafluoride plasma guarantees the maintaining of a narrow opening easily closable by sealing layer 41.

Additionally, the method according to another embodiment of the present invention modulates the shape of the walls 40 of opening 38 with doping ion concentration profile C of layer 33.

Such a modulation of the shape of opening 38 reflects on the shape of the cavity that may be widened.

Such a modulation enables modifying the shape of walls 40 of opening 38.

Figure 1C:
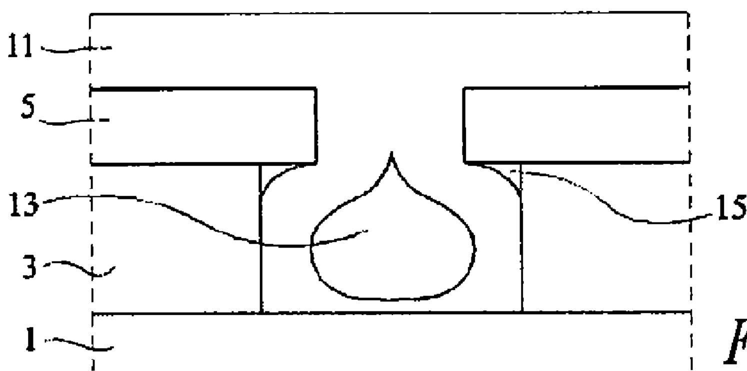
Figure 2:
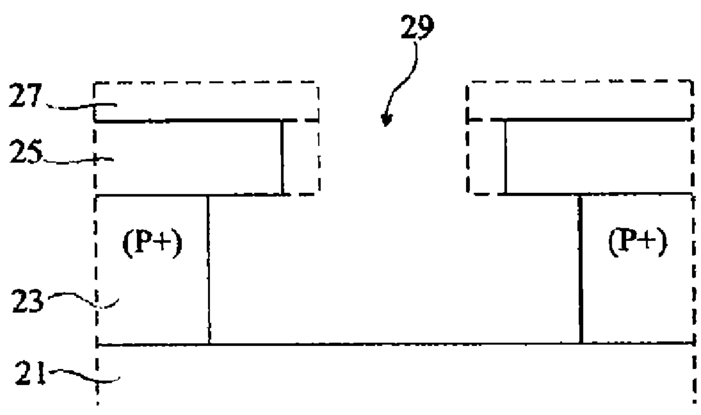
FIG. 2 illustrates, in a partial simplified cross-section view, an intermediary step of the forming of a cavity according to another known method.

Such a modulation enables avoiding at the level of the interface between layers 35 and 33 the forming of an abrupt opening rupture such as that illustrated in FIGS. 1C and 2.

Figures 5, 6:
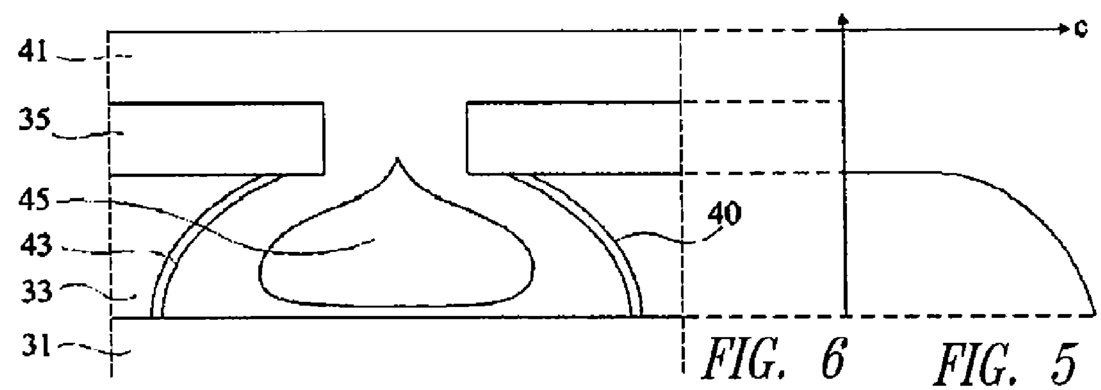
FIG. 5 schematically illustrates another concentration profile in a layer of FIG. 3, according to an embodiment of the present invention.
FIG. 6 illustrates, in partial simplified cross-section view, the cavity formed by means of a layer comprising the concentration profile of FIG. 5, according to an embodiment of the present invention.

Thus, FIG. 5 illustrates a concentration profile of layer 33 such that the doping ion concentration in layer 33 progressively increases from the interface with layer 35 to the interface with underlying integrated circuit 31. Then, as illustrated in FIG. 6, the more layer 33 is doped, the more it is hollowed by the sulfur hexafluoride plasma. Walls 40 of the opening formed in layer 33 exhibit a "smooth" shape similar to that of the doping.

The obtaining of such a "smooth" shape is particularly advantageous in the case of optical devices. Indeed, as indicated, the walls of the cavities obtained by means of the known methods exhibit abrupt ruptures which translate as the forming of angle cavities (15, FIG. 1C) on subsequent deposition of a layer.

However, the method described above avoids in such a subsequent deposition the forming of such angle cavities.

According to an embodiment of the present invention, a thin metal layer 43 is deposited on walls 40, before sealing layer 41 is deposited.

The deposition of such a metal layer was not possible with the more "abrupt" walls of known methods due to the forming of angle cavities. Such cavities would cause a local or total separation of metallic material 43. A local separation would affect the optical properties of the cavity by deforming the metal surface intended to form a mirror.

According to an embodiment of the present invention, layer 33 has a thickness ranging between 200 and 800 nm, for example, on the order of 500 nm, and is doped to a concentration which varies within the range from $10^{17}$ to $3\times10^{18}$ at/cm$^3$;

layer 35 has a thickness ranging between 100 and 500 nm, for example, on the order of 200 nm; and opening 37 has a diameter ranging between 0.15 and 0.4 μm, for example, on the order of 0.2 μm.

Then, after exposure to a sulfur hexafluoride plasma $SF_6$ generated by the application of a 150-W power for 20 s on sulfur hexafluoride $SF_6$ injected at a 50-$cm^3$/mn flow rate and maintained at a 10-mTorr pressure (where 1 Torr=101325/760 Pa) and the deposition of a silicon oxide sealing layer 41 of a thickness on the order of from 100 to 1000 nm, cavity 45 has a dimension ranging between 0.3 and 0.55 μm, for example, on the order of 0.35 μm if opening 37 has a 0.2-μm diameter.

According to an embodiment of the present invention, the walls of cavity 45 are covered with an aluminum layer 43 of a thickness from 10 to 50 nm.

It should be noted that the thickness of layer 35 and the dimensions and shape of opening 37 are selected to optimize the sealing of the lips 39 of opening 37 by material 41. The thickness and the shape of the doping profile of layer 33 are selected to optimize the dimensions of cavity 45.

Of course, the present invention is likely to have various alterations, modifications, and improvements which will readily occur to those skilled in the art. In particular, it should be understood by those skilled in the art that the present invention has been described in an embodiment of the forming of a cavity in optical devices.

It should however be understood by those skilled in the art that the present invention applies to the forming of cavities in devices other than optical devices.

Further, it should be understood by those skilled in the art that one embodiment of the present invention generally enables modulating the shape of an opening in a silica glass layer according to any appropriate shape by correspondingly modulating the concentration profile of the doping ions, phosphorus or fluorine, of the glass.

Figures 7, 8:
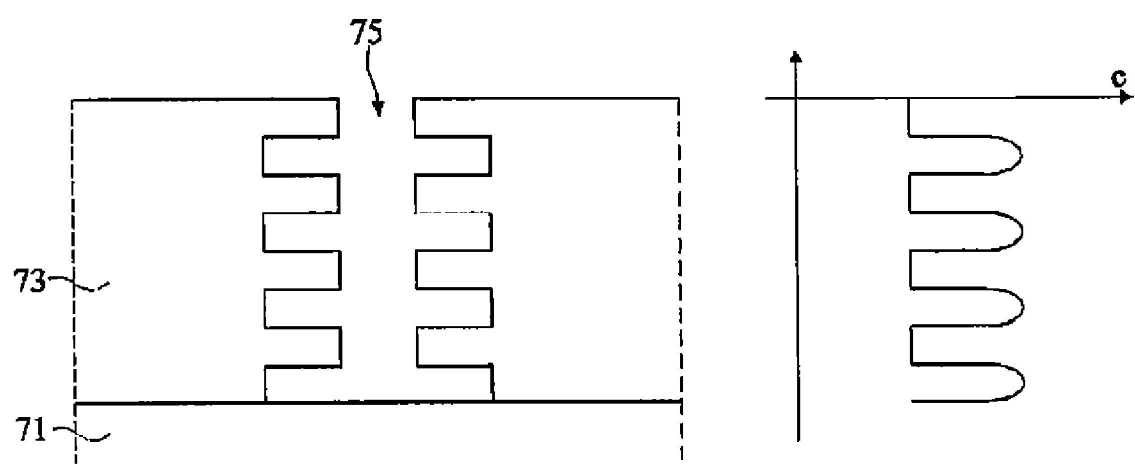
FIG. 7 schematically illustrates another concentration profile in a layer of FIG. 3, according to an embodiment of the present invention.
FIG. 8 illustrates in partial simplified cross-section view the cavity formed by means of a layer comprising the concentration profile of FIG. 7, according to an embodiment of the present invention.

Thus, FIG. 8 illustrates in partial simplified cross-section view an opening 75 obtained when a silica glass layer 73 exhibits an irregular doping profile illustrated in FIG. 7. Layer 73 rests on upper portion 71 of an integrated circuit. The profile of FIG. 7 is an alternation of areas having two distinct levels. As appears from the comparison of FIGS. 7 and 8, the walls of opening 75 reproduce the doping profile of FIG. 7.

According to an embodiment of the present invention, it is possible to give any opening in a silica glass layer any shape, provided that this shape can be drawn by means of a concentration profile.

Such a forming of openings of any shape in a thick insulating layer enables a great number of applications. In particular, as described previously, it enables forming of isolation cavities. It also enables forming devices of complex shapes. Thus, opening 75 of FIG. 7 may be used to form a capacitor of large surface area by the successive conformal depositions of a conductive material, of a thin insulator, and the deposition of a second electrode, either conformally, or to fill opening 75.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method, comprising:

providing a silica glass layer having a doping profile; and forming an opening having a shape similar to the doping profile by non-directionally dry etching the silica glass layer with a non-carbonated fluorinated plasma.

2. The method of claim 1, wherein the doping profile of the layer is formed with doping ions selected from a group consisting of fluorine and phosphorus.

3. The method of claim 2, wherein the concentration of the doping ions in the layer across a thickness of the layer varies within the range from $10^{17}$ to $3\times10^{18}$ at/$cm^3$.

4. The method of claim 1, wherein the etching with the non-carbonated fluorinated plasma is preceded by an etching with a carbonated fluorinated plasma.

5. The method of claim 4, wherein the non-carbonated fluorinated plasma comprises sulfur hexafluoride or nitrogen trifluoride.

6. The method of claim 1, wherein the non-directionally dry etching is performed with no bombarding of the silica glass layer.

7. A method for forming a cavity of a shape in an insulating layer, comprising the steps of:

forming an insulating silica glass layer including a phosphorus or fluorine concentration profile having the shape;

forming a mask including an opening at a location where the cavity is to be formed;

forming an opening in an upper portion of the layer with a carbonated plasma, the opening having lips;

removing the mask;

etching the insulating silica glass layer with a non-carbonated fluorinated plasma; and depositing a sealing material structure to occlude the lips of the opening of the upper portion.

8. The method of claim 7 further comprising, before the step of depositing the sealing material, the step of depositing a thin metal layer on walls enclosing the opening, wherein the sealing material is transparent.

9. The method of claim 8, wherein depositing the sealing material forms at least one cavity of an optical device.

10. A method for forming a cavity, comprising:

forming a doped insulating layer having a doping concentration profile;

forming an insulating layer on the doped insulating layer;

forming a mask on the insulating layer, the mask including an opening;

performing a first etch to form an opening in the insulating layer;

removing the mask; and performing a second etch to form an opening in the doped insulating layer, the opening in the doped insulating layer enclosed by walls, the walls having a shape dependent upon the doping concentration profile.

11. The method of claim 10, further comprising depositing a sealing material to form the cavity, a size of the cavity dependent upon the doping concentration profile.

12. The method of claim 10, wherein the insulating layer is an insulating silica glass layer.

13. The method of claim 10, wherein the doped insulating layer is doped with phosphorous.

14. The method of claim 10, wherein the shape of the walls is dependent upon a shape of the doping concentration profile.

15. The method of claim 10, wherein performing the first etch includes performing the first etch with a carbonated fluorinated plasma.

16. The method of claim 10, wherein performing the second etch includes performing the second etch with a non-carbonated fluorinated plasma.

17. The method of claim 10, further comprising:

depositing a metal layer on the walls that enclose the opening; and depositing a transparent sealing material to form the cavity, a size of the cavity dependent upon the doping concentration profile.

18. The method of claim 10, wherein the doped insulating layer is a doped insulating silica glass layer.

* * * * *